United States Patent [19]
Caldicott et al.

[11] 4,080,657
[45] Mar. 21, 1978

[54] WEIGHT MEASURING SYSTEM WITH AUTOMATIC GAIN CORRECTION

[75] Inventors: Jack Richard Caldicott; Alan David Edwards, both of Stockport, England

[73] Assignee: Railweight Inc. (U.K.) Limited, England

[21] Appl. No.: 686,913

[22] Filed: May 17, 1976

[30] Foreign Application Priority Data

May 21, 1975 United Kingdom ............... 21703/75

[51] Int. Cl.$^2$ .......................... G01G 7/00; G06F 11/02
[52] U.S. Cl. ....................................... 364/567; 177/50; 235/92 WT; 364/571; 364/579
[58] Field of Search ...................... 235/151.33, 92 WT; 177/25, 50, DIG. 3; 340/347 CC

[56] References Cited

U.S. PATENT DOCUMENTS

| | | |
|---|---|---|
| 3,709,309 | 1/1973 | Williams, Jr. et al. ......... 177/DIG. 3 |
| 3,731,754 | 5/1973 | Godwin et al. ................ 177/DIG. 3 |
| 3,737,891 | 6/1973 | Metcalf .......................... 340/347 CC |

*Primary Examiner*—Felix D. Gruber

*Attorney, Agent, or Firm*—George H. Gerstman

[57] ABSTRACT

In electronic measuring systems the accuracy of measurement is affected by drift not only of the zero but of the gain due to temperature changes, aging and supply conditions. The invention provides an automatic gain correction means so as to maintain an accurate relationship between the magnitude of the characteristic being measured and the value displayed or recorded. The measuring system is such that a train of pulses is counted over a predetermined time interval with a train of pulses representing, by its pulse repetition rate, the magnitude of the characteristic. A reference count is provided and means are provided for generating a pulse train simulating a predetermined magnitude of the characteristic being measured. Means are provided for counting the pulses of the generated pulse train and means are provided for comparing the reference count with the count of the generated pulse train to determine any error in the gain. Means are provided for automatically adjusting the predetermined time interval to correct the effect of the determined gain error.

20 Claims, 10 Drawing Figures

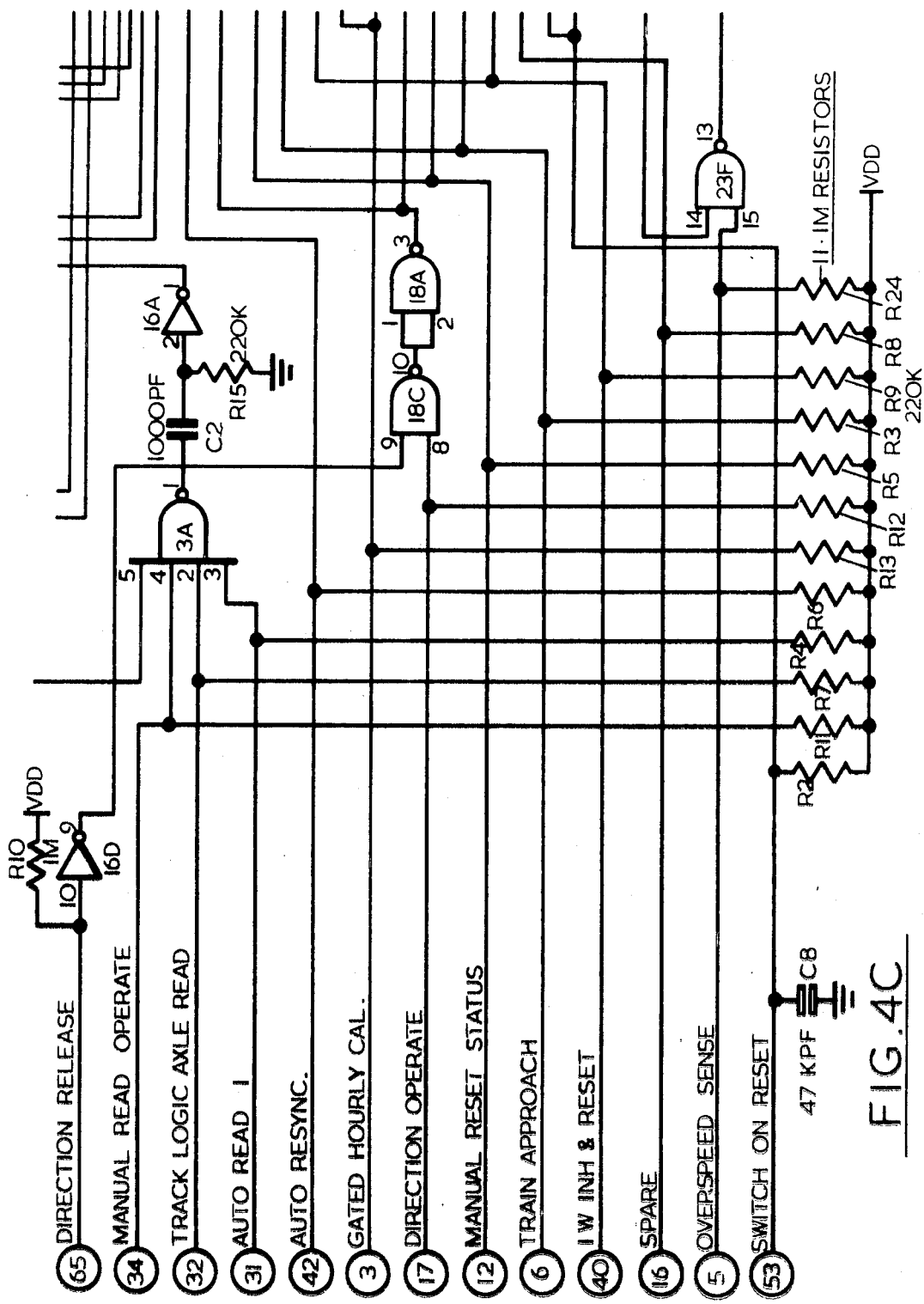

WEIGHT MEASURING SYSTEM WITH AUTOMATIC GAIN CORRECTION

This invention relates to measuring systems for example, weighing systems for the in-motion weighing of railway freight cars.

In electronic measuring systems there is a tendency for the accuracy of measurement to drift not only due to zero error but also to changes in gain consequent upon changes in temperature, ageing of components, variation of supply voltages and the like.

An object of the present invention is to provide means for automatically correcting any changes in gain of an electronic measuring system.

According to one aspect of the invention, there is provided means for automatically correcting the gain of an electronic measuring system so as to maintain an accurate relationship between the magnitude of the characteristic being measured and the value displayed or recorded, the measuring system being such that a train of pulses representing, by its pulse repetition rate, the magnitude of the said characteristic, is counted over a predetermined time interval, wherein means are provided for determining any error in the gain by comparison against a reference and automatically adjusting the predetermined time interval to correct the effect of the gain error.

In the case where the predetermined time interval is determined by counting clock pulses to a predetermined count using a divider chain, the adjustment may be made by altering the clock pulse repetition rate, by varying the dividing factor or by adding or subtracting pulses to or from those provided by the clock.

According to another aspect of the invention there is provided auto gain means for automatically correcting the gain of an electronic weighing system so as to maintain an accurate relationship between the weight of a load being measured and the value displayed or recorded, the weighing system being such that a train of pulses representing, by its repetition rate, the weight of the load, is counted over a predetermined time interval, comprising means for establishing said predetermined time interval by counting a predetermined number of pulses in a network supplied with clock pulses and with additional pulses, the number of which additional pulses corresponds to a nominal value if the required gain correction is zero but which otherwise corresponds to a correction value which varies about the nominal value according to the magnitude and sign of the correction of gain required, means for introducing a reference into a load measuring circuit to simulate precisely a predetermined load value, means for passing the reference weight-pulses to a gain counter over the nominal time interval and means for utilising the least significant digits of the count order as the nominal value to represent the correction value for determining the number of additional pulses to be fed to said network during each weighment.

If the correction value is higher than the nominal value then more additional pulses will be fed to the network so that the predetermined count to determine the count time interval will be reached sooner and the gain of the system will effectively be reduced to restore the correct gain.

Conversely, if the correction value is lower than the nominal value then less pulses will be fed to the network so that the predetermined count to determine the count time interval will be reached later and the gain of the system will effectively be increased to restore the correct gain.

Embodiments of the invention will now be described, by way of example, with reference to the accompanying drawings, in which:-

FIGS. 3A, 3B, 3C and 3D, when connected together, form a logic diagram of a printed circuit card providing automatic zero and gain control functions.

FIGS. 4A, 4B, 4C and 4D, when connected together, form a logic diagram of a printed circuit card providing measurement interval and reset functions.

Figure 1:
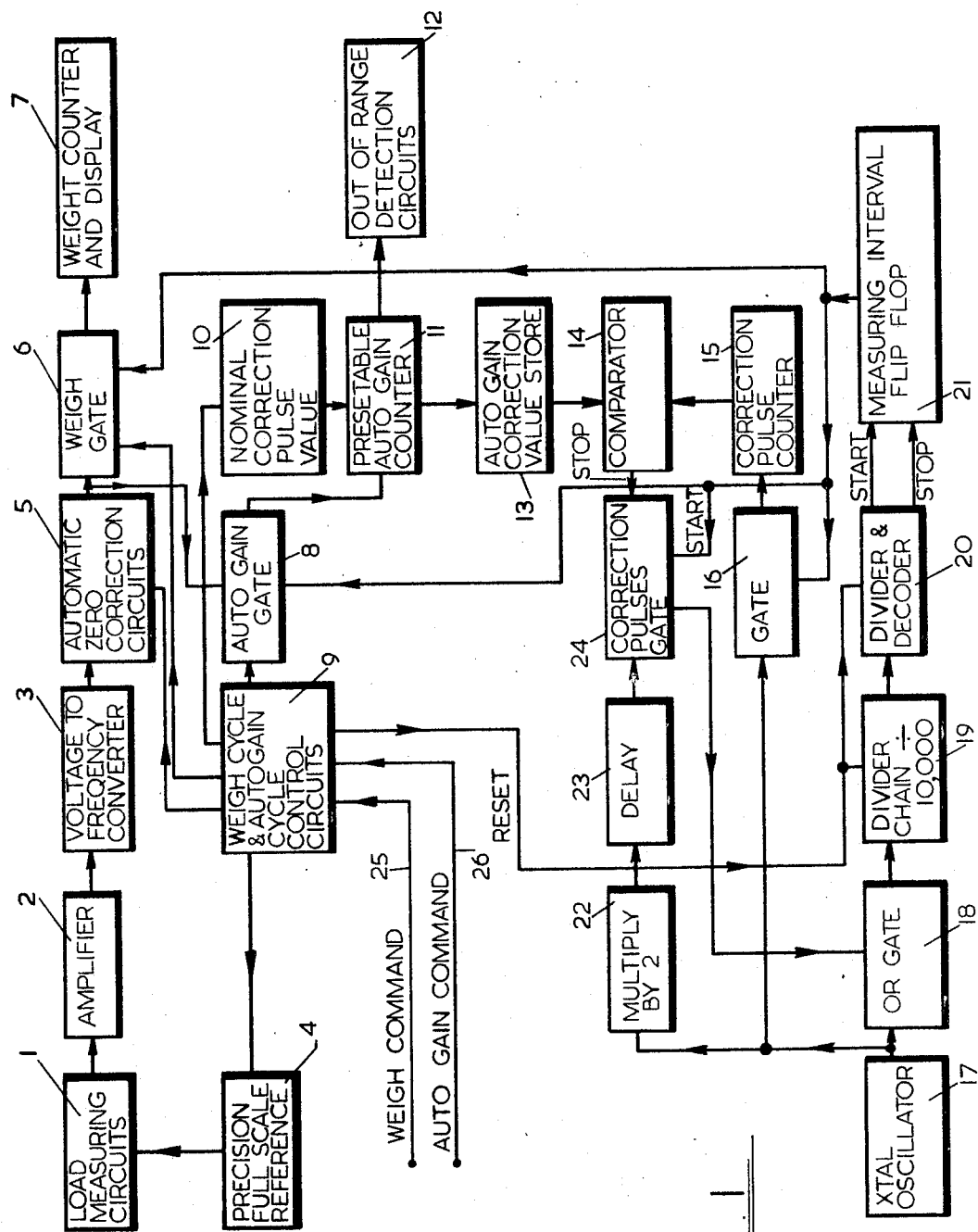
FIG. 1 is a schematic block diagram of a weighing system, in accordance with the invention.

In FIG. 1 reference 1 indicates a load measuring circuit which may be an arrangement of load cells supporting a weigh rail of an in-motion weighing machine. The load cell arrangement provides an output related to the load which output is fed to amplifier 2 and then to a voltage-to-frequency converter 3. The output of converter 3 is in the form of a pulse train, the repetition rate of which is related to the load. The pulse train is fed via an automatic zero correction circuit 5 to eliminate the effects of zero or balance changes and thence to a weigh gate 6 which is enabled for a predetermined time, the count of allowed pulses being displayed and recorded in a suitably calibrated unit in a weigh counter and display 7. The pulses are counted over an interval of time so that the indicated count is a function not only of the load but of the duration of the count interval. Thus any change in the overall gain of the system may be compensated for by appropriate adjustment of the count interval.

Weigh gate 6 is opened and closed by a measurement interval flip flop 21 provided with "stop" and "start"-signals from a divider and decoder 20. The time interval is derived from crystal oscillator 17 which feeds clock pulses through an OR gate 18 and a divider chain 19 to the decoder 20. In the embodiment the pulse repetition rate of oscillator 17 is 100 KHz, and the division in chain 19 is 10,000, the nominal time interval is 0.2 seconds and the smallest displayed weigh increment is 0.01% of full scale load i.e. equivalent to 20 microsecond or two 10 microsecond pulses of oscillator 17.

To increase or decrease the count interval it is necessary to reduce or increase respectively the pulse rate at OR gate 18. If the pulse rate is reduced then the time interval to count a specific number will increase, and vice versa.

The range over which automatic gain is required is first determined and if, say, the range is a hundred pulses then a centre value of fifty is set as the nominal correction value in nominal correction pulse value unit 10. At the appropriate time as will be explained later the nominal correction value is transferred through presetable auto gain counter 11 into auto gain correction store 13.

Let us consider a weighing cycle before an automatic gain correction cycle has taken place. The load is represented by a pulse repetition rate at coverter 3. A weigh command signal fed on line 25 to weigh cycle and auto gain cycle control circuit 9 causes gate 6 to be set and divider chain 19 and divider and decoder 20 to be reset. At the next "start" output of flip flop 21 gate 6 is opened and pulses pass to display 7. Clock pulses from oscillator 17 pass to OR gate 18, to a gate 16 and to a multiplier 22, the multiplication being a factor of 2. The output of flip flop 21, besides opening gate 6, also opens gates 16 and 24. Clock pulses pass through gate 16 to correction pulse counter 15 and the count therein is compared in a comparator 14 with the count in store 13. In the meantime the pulses from multiplier 22 are delayed in delay 23 so as to stagger them in relation to the clock pulses and then passed through correction pulse gate 24, which is open, to OR gate 18 where their number is added to that from oscillator 17. When the count in counter 15 is equal to the count in store 13, comparator 14 passes a "stop"signal to gate 24 to close it. Thus twice the number of pulses have been added in at OR gate 18 as are represented by the count in store 13. When the appropriate count has been received, decoder 20 issues a "stop" signal which turns flip flop 21 back and closes gates 6 and 16, the closing of gate 6 terminating the predetermined time interval so that count in display 7 is a representation of the weight of the load.

When an automatic gain correction cycle is required, an auto gain command is received on line 26, which command can be initiated automatically at regular intervals if required. This command is received in control circuit 9 which causes an automatic zero correction cycle to be performed, the correction being effected in correction circuit 5 so that at the end of the zero correction cycle any zero error is compensated for. Next, control circuit 9 causes a precision reference 4 which precisely simulates a full scale load, to be introduced into the load measuring circuit 1 with the result that a train of pulses with zero correction, if any, will appear at the output of circuit 5. Control circuit 9 also sets auto gain gate 8 and resets divider chain 19 and divider and decoder 20 to zero and causes the nominal correction pulse value in circuit 10 to be set into gain counter 11. In turn auto gain store 13 is set to the value in counter 11.

Pulses from oscillator 17 cause divider chain 19 to start counting and, after a predetermined time to allow the system to settle, flip flop 21 is set opening gate 8 to allow weight pulses into auto gain counter 11 and opening gates 16 and 24. As already described, twice the number of nominal correction pulses will be added to the clock pulses from oscillator 17. When the predetermined count of combined clock and additional pulses is reached decoder 20 resets flip flop 21 closing gate 8 and gain counter 11 is left with a particular store value which may be higher or lower than the count including the nominal correction value corresponding to full scale. The count is examined in a detection circuit 12 which provides a warning and inhibits further operation if the count differs from the full scale value by more than ± the nominal correction value. Assuming that the count is not outside this permitted range, the last few digits, in the case of a nominal correction value of 50 then the last two digits, are transferred to store 13 and are used as the correction value in all weighings until the next auto gain correction cycle is performed. The time interval over which the weight pulses are counted is increased or decreased about the nominal value according to the correction called for by the last correction cycle. The effect of this is to adjust the gain of the overall system to provide a correction not only at full scale but proportionate correction throughout the range.

Figure 2:
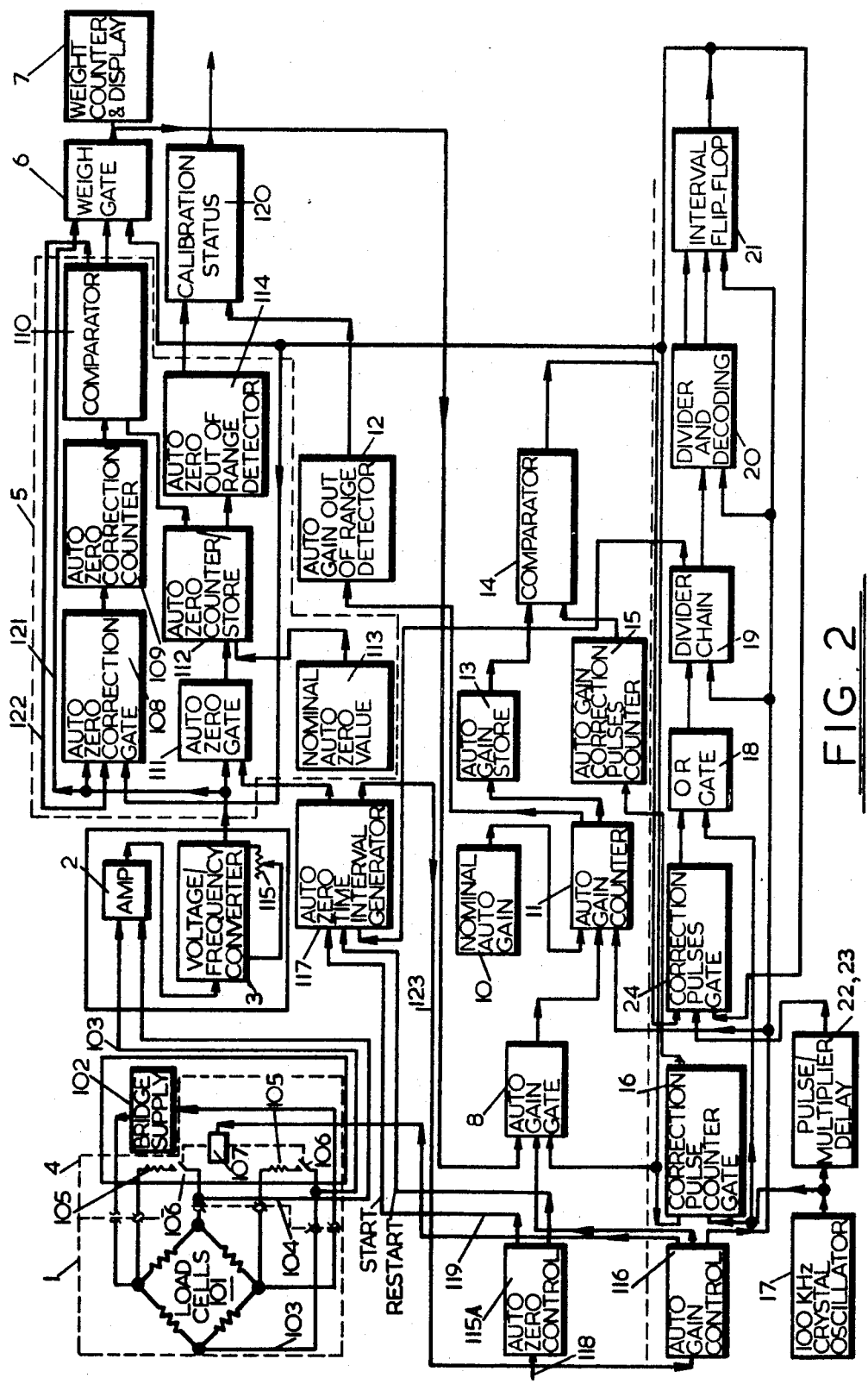
FIG. 2 is a more detailed diagram of a slightly modified weighing system, in accordance with the invention.
Figure 3A:
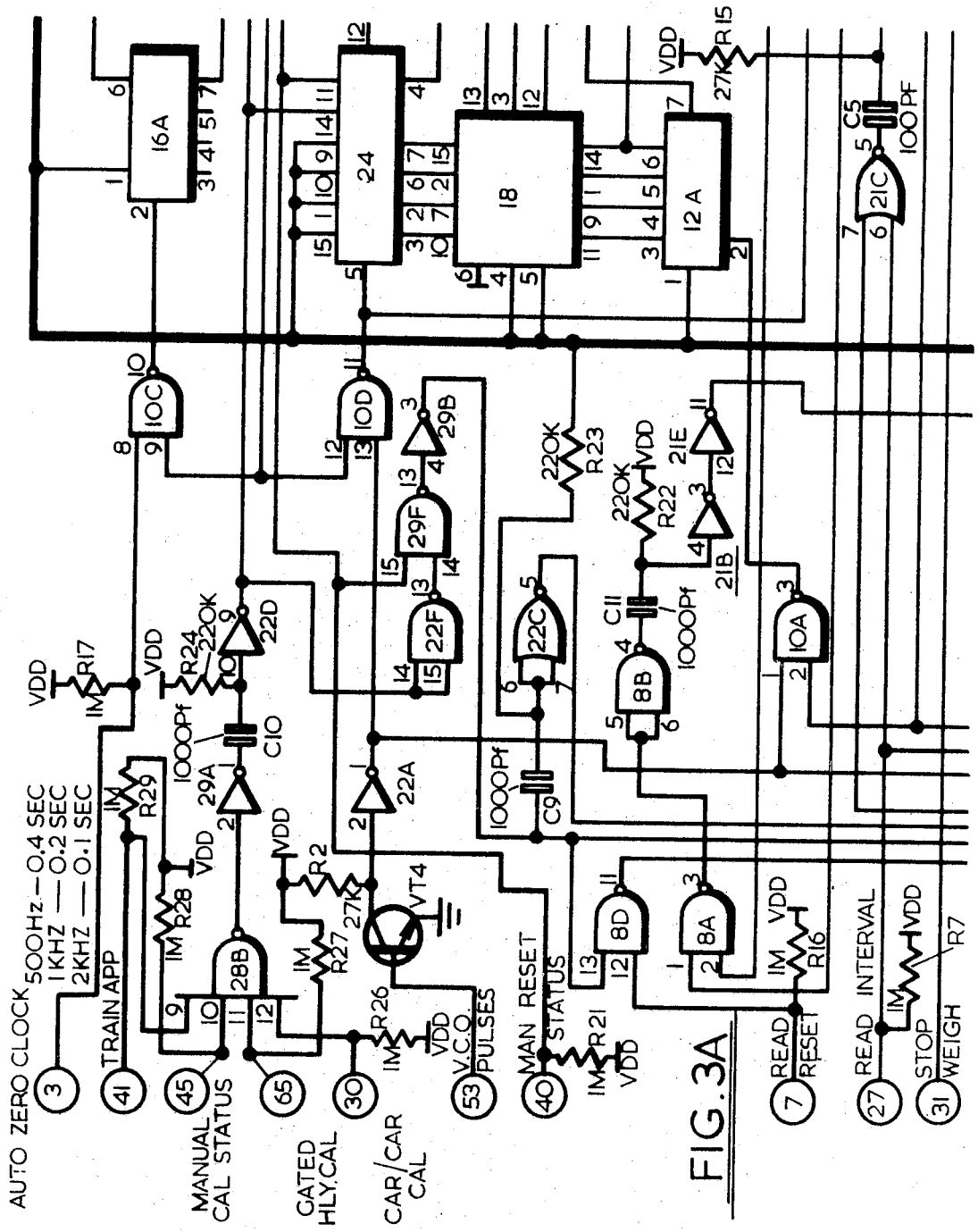
Figure 3B:
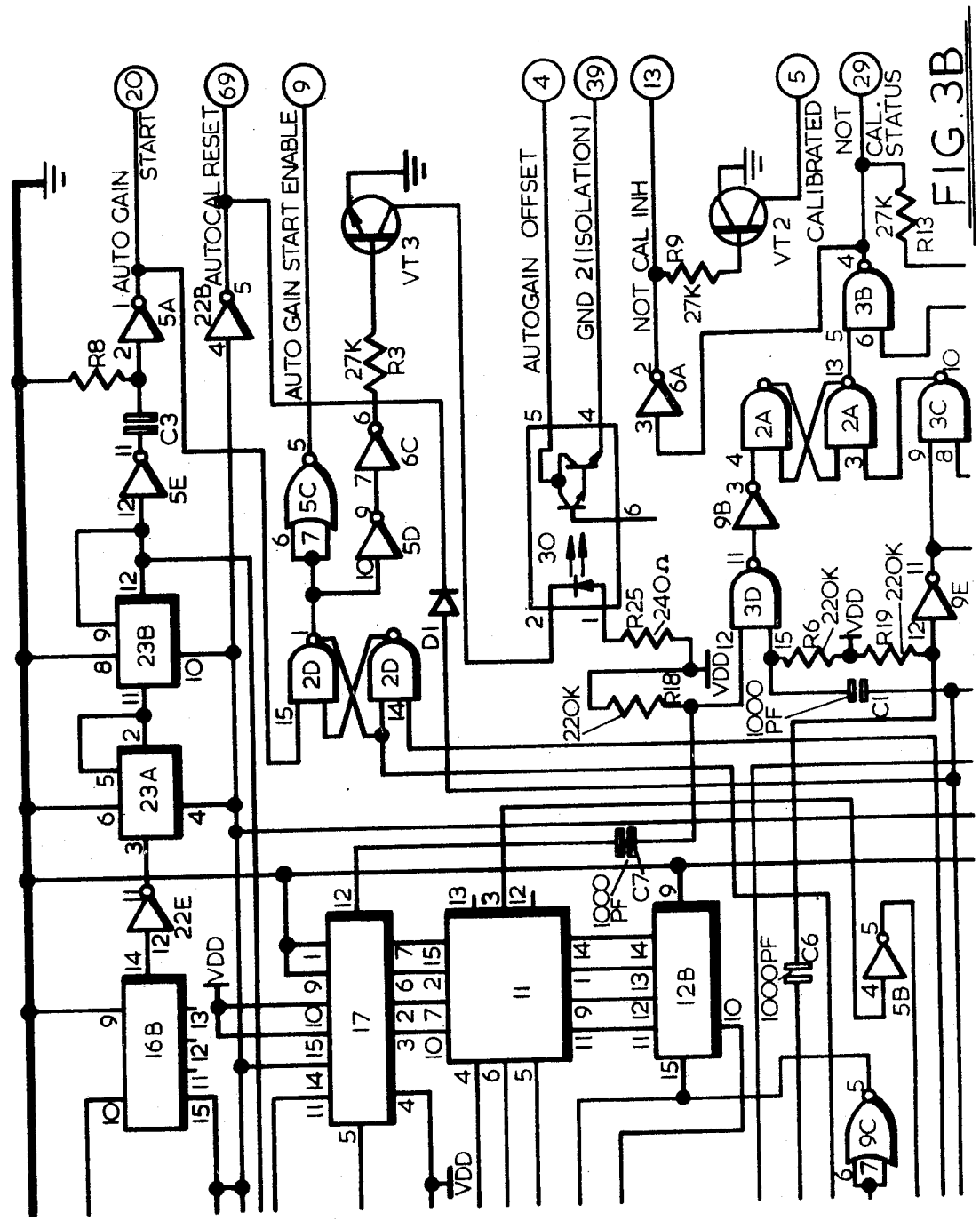
Figure 3C:
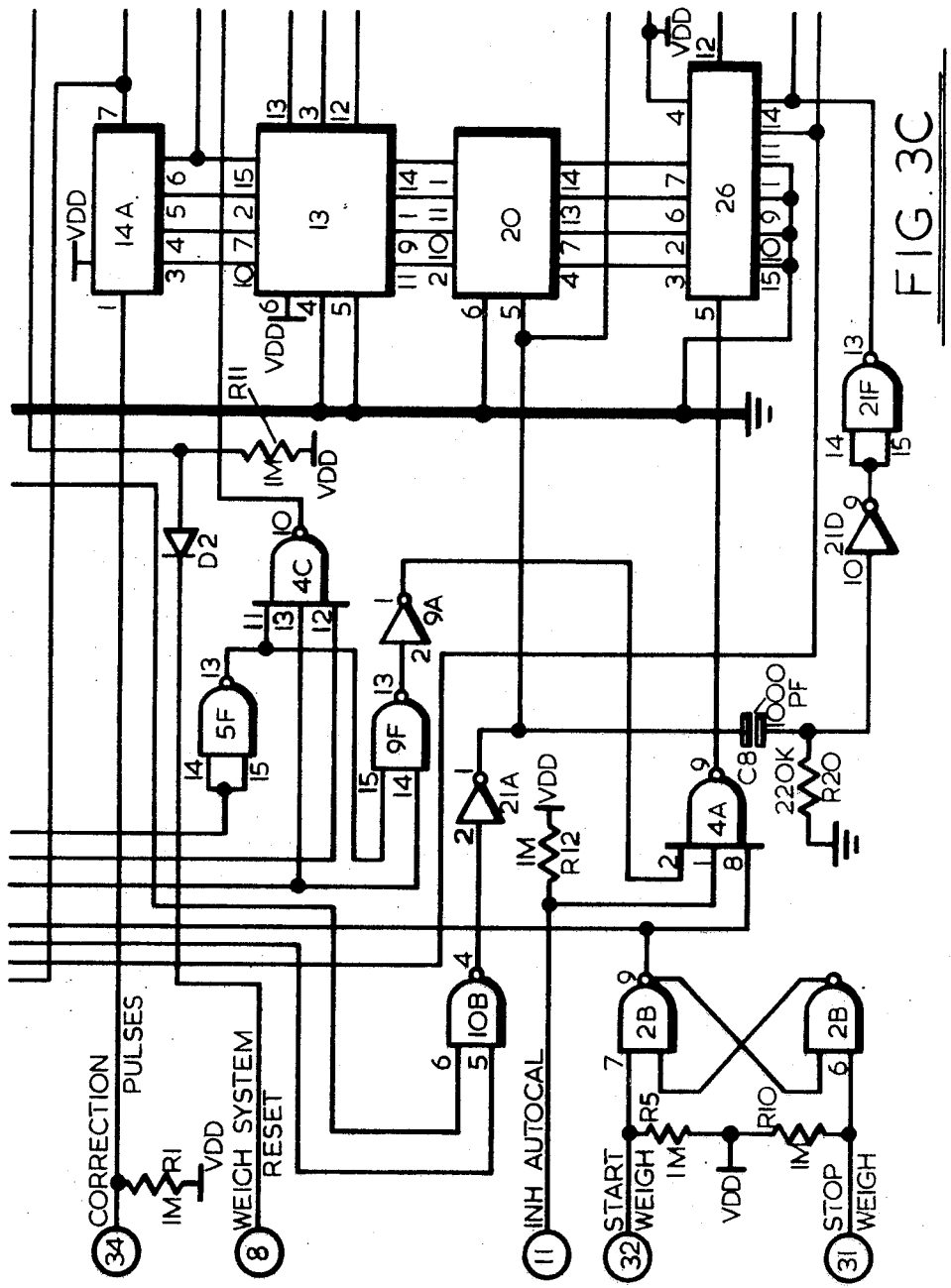
Figure 3D:
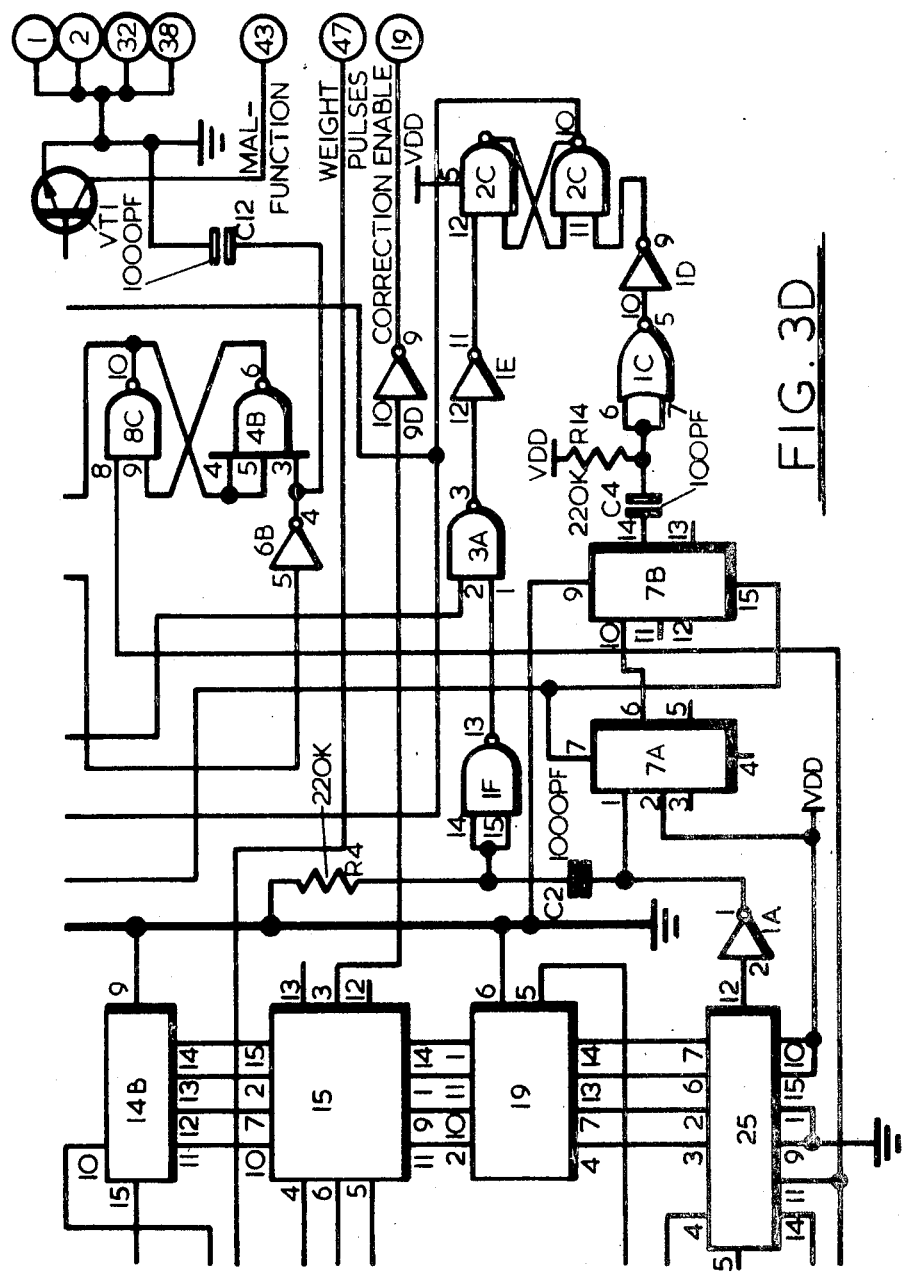
Figure 4A:
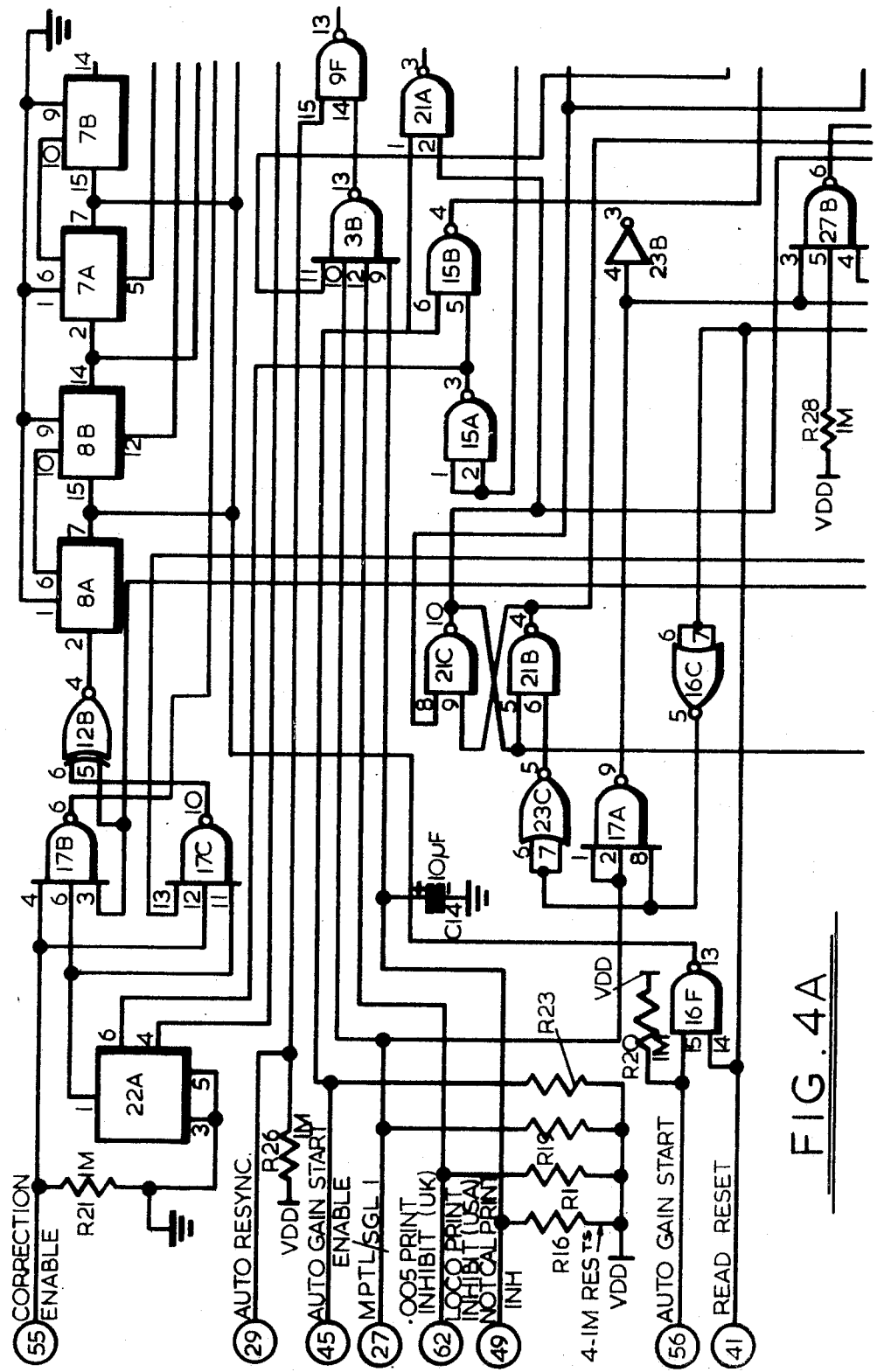
Figure 4B:
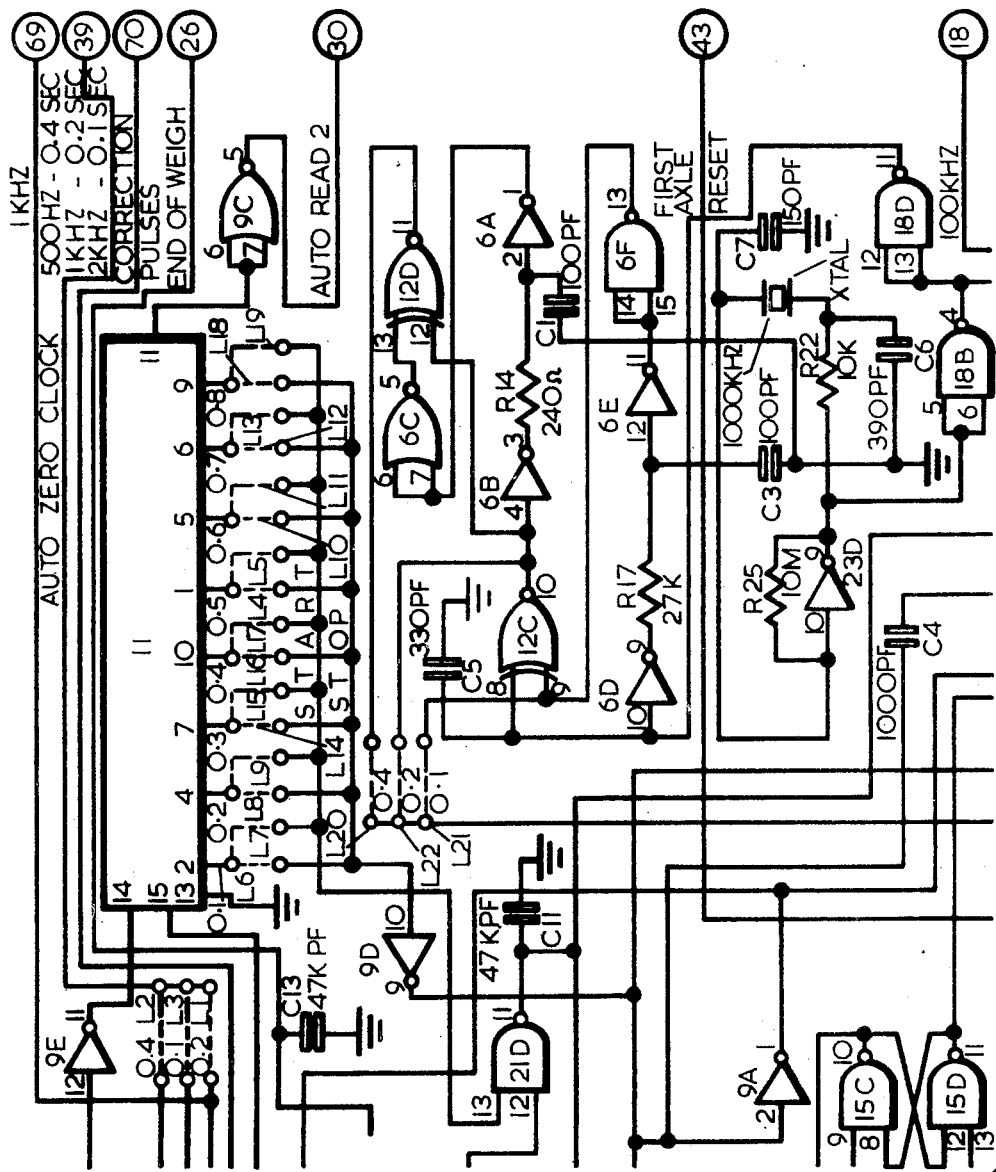
Figure 4D:
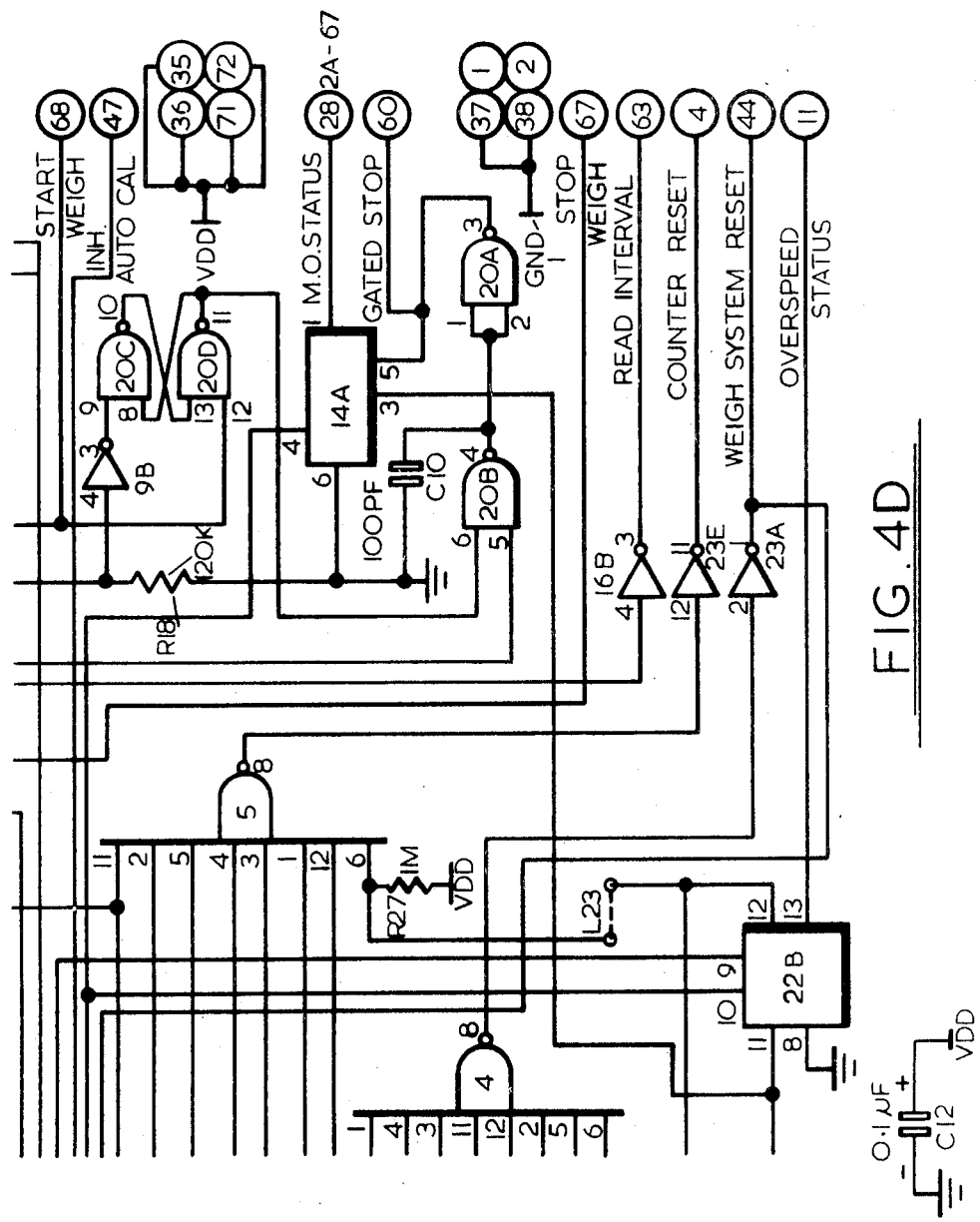

FIG. 2 is a more detailed diagram of a slightly modified weighing system. Where possible the same reference numeral as in FIG. 1 has been used for the corresponding part in FIG. 2.

The load measuring circuit 1 comprises a bridge circuit 101 of load cells which support a weigh rail of an in-motion weighing machine. The bridge circuit is supplied across the input diagonal by a D.C. regulated power supply 102. The output diagonals are taken on lines 103 and 104 to amplifier 2.

The automatic zero correction circuits 5 comprise a correction gate 108, a correction counter 109, a comparator 110, a gate 111, a counter/store 112, a nominal value store 113 and an out-of-range detector 114. The principle of automatic zero adjustment is to offset the system zero by adjustment of potentiometer 115 associated with voltage/frequency converter 3, such that it is normally 50 counts above zero, i.e. if the weigh interval is 0.2 seconds then the output frequency of the converter 3 will be 250 pulses per second thus giving 50 pulses in 0.2 seconds. To obtain true system zero therefore, 50 pulses have to be effectively subtracted from the weight pulses fed to the weight counter 7. The range of correction of the auto zero circuit 5 is ± 50 pulses.

Auto zero control 115A, auto gain control 116 and auto zero time interval generator 117 correspond to weigh cycle and auto gain cycle control circuits 9. During an auto zero check cycle, an auto calibrate command signal is received on line 118 by auto zero control 115 which issues an/auto zero start command on line 119 to generator 117 which opens auto zero gate 111 for 0.2 seconds. The output from converter 3 is thus fed to the auto zero counter/store 112 and the pulses are counted for an interval of 0.2 seconds. At the end of this interval a value will be stored which is equal to the nominal offset of 50 counts ± any zero drift, i.e. if there has been a positive drift of 10 counts then the stored value will be 60 or if there has been a negative drift of 10 counts then the stored value will be 40. Out-of-range detector 114 ensured that the system zero is within the correction range of ± 50 counts from nominal and if an out of range condition is detected a calibration status indicator 120 connected to detector 114 is prohibited from indicating a satisfactory calibration condition.

On subsequent weighing cycles, the weight pulses, during a weigh interval, pass via auto zero correction gate 108 to auto zero correction counter 109 whose count value is compared in comparator 110 with the count value stored in counter/store 112. As soon as comparison is reached, the weigh gate 6 is enabled and zero corrected weight pulses pass to the weight counter directly on line 121. At the same time correction gate 108 is closed by an output on line 122. Nominal value store 113 stores the nominal count of 50 and if the zero is manually reset, for example, if the zero goes out of automatic correction range, the nominal count from store 113 is used to preset the correction counter 112.

Across each of two opposite arms of the bridge is connected a precision resistor 105 in series with contacts 106 forming part of an autocalibration relay arrangement 107. The contacts 106 are closed during autogain calibration so that the resistors 105 are connected across the bridge arms producing an output from the bridge corresponding to full load.

A short time after an automatic zero check cycle is completed an automatic gain check cycle is initiated by a signal from interval generator 117 on line 123 to auto gain control 116. The latter causes relay arrangement 107 to operate by a signal on line 124 and thereby resistors 105 are connected across the bridge arms, producing an output from the bridge corresponding to full scale. Auto gain control 116 also sets auto gain gate 8 and resets auto gain counter 11, divider chain 19, divider and decoder 20 and measuring interval flip-flop 21. The resetting of auto gain counter 11 causes the nominal correction pulse value in nominal auto gain circuit 10 to be loaded into store 113 via counter 11, to ensure that the auto gain check is performed over the nominal weigh interval. The measuring interval, both during an auto gain check and a weighing cycle, occurs approximately half a second after the check cycle has been initiated.

As already described, the stop and start signals for the beginning and ending of the measuring interval are derived from 100 KHz crystal oscillator 17, OR gate 18, divider chain 19, divider and decoder 20 and flip-flop 21. To the oscillator pulses are added twice the nominal 50 pulses via OR gate 18. During the measuring interval zero connected weight pulses are fed via auto gain gate 8 into autogain counter 11 and at the end of the interval counter 11 is left with a count the two least significant digits of which correspond to the nominal count of 50 ±any gain error. In the event that the gain error lies outside the correction range the out-of-range detector 12 prohibits the calibration status indicator 120 from indicating a satisfactory calibration condition. When a satisfactory calibration condition exists the count which includes any gain error is transferred from counter 11 to autogain store 13 to be used in the manner already described in relation to FIG. 1 for the purpose of adjusting the measuring interval to correct any gain error.

FIGS. 3 and 4 are logic diagrams of printed circuit cards for the automatic zero and gain connecting circuits and for the time interval determining circuits including reset. The integrated circuits forming the units shown in FIG. 2 are identified as follows:-

|  | Integrated circuits |
|---|---|
| Weigh gate 6 | 4c |
| Auto gain gate 8 | 4A, 9F |
| Nominal auto gain correction 10 | 25, 26 |
| Auto gain counter 11 | 25,26 |
| Auto gain, out-of-range detector 12 | 1C,2C,3A |
| Auto gain store 113 | 19,20 |
| Comparator 14 | 13,15 |
| Correction pulse counter 15 | 14A,14B |
| Correction pulse counter gate 16 | 17B |
| Oscillator 17 | 18B,18D,23D |
| OR gate 18 | 12B |
| Divider chain 19 | 7A,7B,8A,8B |
| Divider and decoder 20 | 11 |
| Interval Flip-Flop 21 | 15C, 15D, 22A |
| Multiplier/delay 22, 23 | 6A,6B,6C,6E, 6F,12C,12D |
| Correction pulses gate 24 | 17C |
| Auto gain correction gate 108 | 10A |
| Auto gain correction counter 109 | 12A,12B |
| Comparator 110 | 11, 18 |
| Auto gain gate 111 | 10D |
| Auto zero counter/store 112 | 17, 24 |
| Nominal auto zero value 113 | 17, 24 |
| Auto zero out-of-range detector 114 | 3D, 9E, 2A |
| Auto zero control 115 | 28B,29A,22D |
| Auto gain control 116 | 2D, 5C, 5D, 6C |
| Interval generator 117 | 16A, 16B, 23A, 23B |
| Calibration status 120 | 3B |

The functions performed on the card shown in FIG. 3 are as follos:-v

Automatic Zero

During an automatic zero operation, V.C.O. pulses are fed via gate 10D to counters 24 and 17. These counters form the automatic zero value store. The status of cross coupled gate 2A indicates whether the automatic zero function has been performed satisfactorily, i.e. the zero of the system is within the zero correction range. The first pulse out of 10D during an auto zero cycle sets zero status bistable 2A to a "within limits" state, but if counter 17 spills over, i.e. more than 100 pulses are fed into counters 24 and 17, then bistable 2A is set to "not within limits" state, i.e. 2A 13 is set to a logic "0". At the end of an automatic zero cycle counters 24 and 17 will be left with a residual count, nominally 50. On subsequent normal read or weigh cycles the V.C.O. input pulses are routed into counters 12A and 12B, which count up until they reach the same value as in the auto zero store counters 24 and 17. Counters 24 and 17 are compared with counters 12A and 12B by comparator chips 18 and 11. When comparison is reached gate 10A is inhibited and no further pulses enter counters 12A and 12B. At the same time gate 4C, which was previously inhibited by the comparator output, in enabled thus allowing V.C.O. pulses to pass out of pin 47 of the card. These pulses go to the weight counter card.

It should be noted that the auto zero store 17 and 24 is loaded with the nominal value of 50 on a manual reset. This ensures that when the manual reset is depressed the auto zero will be at its nominal mid point condition, and to obtain a one increment reading on the display then the output from the V.C.O. must be 51 pulses over the selected weigh interval.

Counters 16A, 16B, 23A and 23B form the time base for the auto zero operation. Pulses derived from the crystal oscillator on the digital clock and read/reset card shown in FIG. 4 are applied to pin 3 of the printer circuit socket. The frequency of these pulses depends upon the weigh interval selected. The pulse appearing on 23B 12, i.e. at the output of the counter chain, is either 0.1 seconds, 0.2 seconds or 0.4 seconds long depending upon the selected weigh interval. This pulse is applied to gate 10D 12 which is enabled for the appropriate time during an auto zero operation. The trailing edge of the pulse at 23B 12 is used to fire a monostable comprising invertor 5A and resistor R8 and capacitor C3. The pulse derived is used to initiate the automatic gain operation and via cross coupled gate 2D, transistor BT3 and opto isolator 30, causes the automatic gain, offset or calibration resistors to be switched across the load cells.

AUTOMATIC GAIN

Upon a manual reset and at the start of an automatic zero/automatic gain cycle, counters 26 and 25 form the auto gain store. During an automatic gain cycle V.C.O. pulses are fed into counters 26 and 25 over the nominal weigh interval. The nominal weigh interval can be either 0.095 seconds, 0.199 seconds or 0.398 seconds. In all instances, however, the V.C.O. pulses are not allowed into the counters until the automatic zero comparator reaches comparison, i.e. any zero error has been corrected for. The automatic gain offset applied to the load cells is adjusted to produce exactly 10,050 pulses over the nominal weigh interval. Counters 7A and 7B together with ICs IF, 3A, 1E, 1C, 1D and cross coupled gate 2C form a detector circuit to check that the automatic gain value is within the limits 10,001 and 10,099, i.e. a range of ± 50 about the nominal. Bistable formed by cross coupled gate 2C is the gain calibration status bistable, the output of which is fed to gate 3B so that if both the zero status bistable and the auto gain status bistable are set to logic "1"s then the system is deemed to be in calibration. If either the auto zero or the auto gain status bistable are at a logic "0" then the system is deemed to be out of calibration. The output of gate 3B is used to derive "calibrated" and "not calibrated" signals.

It should be noted that the nominal interval for the automatic gain operation is obtained as follows: Counters 26 and 25 are loaded with a count of 50 when a manual reset or an automatic zero/gain cycle is initiated. On the back edge of this manual reset or zero auto cal initiation pulse, monostable comprising IC 22C, resistor R23 and capacitor C9 triggers causing the value loaded into counters 26 and 25 to be transferred to latches 19 and 20. At the end of this transfer pulse a further pulse is generated via C8, R20 and IC 21D which resets counters 25 and 26 to zero ready for the automatic gain sequence. The values set into latches 19 and 20 control the number of gain correction pulses which are introduced into the clock counter chain on the Clock & Read/Reset Card shown in FIG. 4. Correction pulses occur on pin 34 of the edge connector during the selected weigh interval and have a frequency of 100 k/cs. These are fed into counters 14A and 14B. When the value of the count in 14A and 14B is the same as the value stored in latches 20 and 19 then comparators 13 and 15 cause the level on the output of the comparators 1C 15, pin 3, to change thus stopping the gain correction pulses going into the clock chain of the Clock and Read/Reset Card. The gain correction pulses going into the clock chain on the Read/Reset Card are relayed in a direct ratio of 1 to 1, 2 to 1 and 4 to 1, to the 100 k/c pulses being applied to counters 14A and 14B; that is, if the weigh interval is approximately 0.2 seconds, then for every 100 k/c pulse going into counter 14A two gain correction pulses will be entered into the clock chain of the Read/Reset Card.

During the automatic gain cycle the V.C.O. pulses are fed into counters 26, 25, 7A and 7B, and assuming that the number of pulses occurring during the weigh interval are within 10,050 ± 50 then the gain status bistable 2C will be set to calibrated state and counters 26 and 25 will be left with a value directly related to the amount of weigh interval time correction required. This is nominally a count of 50, but if the gain of the system had increased then counters 26 and 25 would be left with a value in excess of 50, i.e. 75. Similarly, if the gain of the system was lower than nominal, then counters 26 and 25 would be left with a count less than 50, i.e. 20. At the end of the automatic gain interval, assuming that the automatic gain status bistable is set to the calibrated state, then an output of gate A occurs triggering monostable comprising C11, R22 and 1C 21B, which in turn causes the value stored in counters 26 and 25 to be transferred into latches 19 and 20. This value remains in latches 19 and 20 until either a new auto zero/auto gain cycle is initiated, or a manual reset occurs.

During a normal read cycle the operation of the automatic gain circuitry is essentially as described above, i.e. correction pulses going into counters 14A ad 14B to obtain a comparison with latches 19 and 20, but in this V.C.O. pulses are not fed into auto gain counters 26 and 25.

Zero auto cal cycles can be initiated by signals appearing on pins 41, 45, 65 and 30 of the edge connector for this card.

FIG. 4 shows the card which provides the time base signals for the weigh cycle and weigh interval plus most of the necessary reset control logic for the weighing system operation.

A 100 k/c crystal oscillator formed by resistors R22, R25, capacitors C7, C6, a 100 k/c crystal and IC 23D, is the master oscillator for the weighing system. A 100 k/c output is fed via IC 18B, gate 17B and gate 12B to the counter or timing chain comprised of decade counters 8A, 8B, 7A, 7B and 11. Decade counter 11 has de-coded outputs giving outputs in approximately 0.1 second increments from 0.1 to 0.9. These de-coded outputs can be strapped by links L6 to L19 to give the desired weight time and weigh interval time.

The weigh interval can be either 0.1, 0.2 or 0.4 seconds, while the weight time can be selected as required with the limitation that the weight time plus the weigh interval must not exceed 0.8 seconds.

The start weigh interval pulse is selected by odd numbere links while the weigh interval stop signal is selected by even numbered links. The start weigh interval signal passes via gate 21D to pin 68, flip flop 20C and 20D and via invertor 15A to flip flop 22A, and also via gate 15B to flip flop 15C, 15D. The stop signal selected passes via invertor 9D to pin 67, flip flop 15C, 15D, and flip flop 21C, 21B and via invertor 9A to gate 20B.

Flip flop 15C, 15D is the weigh interval flip flop and remains set, i.e. 15C, pin 10, at a logic "1" for the selected weigh interval. The weigh interval signal passes via inverter 16B to pin 63 which connects to the auto zero and auto gain card for controlling the flow of V.C.O. pulses.

When a weigh cycle or an auto gain cycle is initiated by a signal appearing at pin 13 of gate 16F then the clock counter/chain 8A, 8B etc. is reset to zero. When this start pulse disappears, i.e. pin 13 of 16F returns to a low, then the clock counter chain will start counting, and after the selected weight interval a start pulse will be generated.

Flip flop 21C and 21B is the weigh cycle flip flop and is set when a read signal appears. Therefore, this flip flop is set for the complete weigh cycle time, i.e. the weight time plus the weigh interval. The output of this flip flop is used to gate the overspeed status flip flop 22B.

For the automatic gain correction circuitry additional frequencies have to be generated from the 100 k/c oscillator. These are 200 k/cs and 400 k/cs. These additional frequencies are generated by ICs 6A, 6B, 6D, 6E, 6F, 12C, 12D, resistors R14, R17 and capacitors C1, C3 and C5. The required frequency depends on the weigh interval and is selected by straps L20, L21, L22, i.e. with L22 fitted then a frequency of 200 k/cs is applied to gate 17C, pin 13. Gate 17C is enabled for the weigh interval by flip flop 22A and also by the correction enable signal on edge connector pin 55 from the automatic gain card. The frequencies generated for the automatic gain circuitry have pulse widths and positions such that they can be inserted between the normal 100 k/c pulses fed into the clock chain via gate 12B.

A read signal to commence a weigh cycle can be generated by either a manual read operation, a track logic axle read, or an automatic read applied to gate 3A. A end of weigh signal appears on pin 26 of the edge connector via gates 3B and 9F when weigh interval flip flop 15C, 15D returns to its reset condition, i.e. when 15C, pin 10, returns to a logic "1". This transition only passes through gate 3B if the multiple single line is at a logic "1". All three lines will normally be at a logic "1" on the last axle of a vehicle provided it is not a locomotive. An "end of weigh" signal can also be generated when the auto resync. line is at a logic "0" via pin 15 of gate 9F.

There are several resets generated on this card, namely:-

Connector 41. — Read/Reset on pin 41, generated every time a weigh cycle is initiated via gate 3A.

Connector 43. — 1st Axle Reset, generated on the 1st axle of a vehicle being weighed, i.e. normally not a locomotive. This is via gate 17A and is, in effect, a Start/Read pulse gate with the input from the track logic on the multiple single line.

Connector 4. — Counter Reset to reset the display generated via gate 5, which is input from 1st Axle Reset, Auto Resync., Direction Release Gate with Direction Operate, Manual Reset, Train Approach, Individual Wagon Inhibit and Reset, Hourly Cal, and, via Link L, Overspeed, generated by flip flop 22B.

Connector 44. — Weigh System Reset, generated via gate 4 which receives inputs from Hourly Cal, Direction Release gated with Direction Operate, Manual Reset, Train Approach, Individual Wagon Inhibit and Reset, and Switch-On-Reset.

The clock frequency for the auto zero circuits on the auto zero/auto gain card shown in FIG. 3 are fed to Connector 39 via links L1, L2 and L3, depending on the time interval selected. These are merely output frequencies tapped off the clock chain.

Flip flop 14A is the marginal overspeed status bistable. The overspeed sense is applied to 14A via gate 23F. 23F is gated with the overspeed bistable 22B so that if an overspeed occurs this over-rides the marginal overspeed condition. Flip Flop 20C, 20D, is set by th start pulse and reset at the back edge of the stop pulse, i.e. 0.1 seconds after stop. The status of 20C, 20D, is fed via gate 20B and invertor 20A to the data input of flip flop 14A. 20B is also gated with the stop pulse, so that for 0.1 seconds after stop a logic "1" is present on pin 5 of 14A. If an overspeed sense occurs during this time interval on pin 3 of 14A, then 14A is set to a marginal overspeed state, i.e. a logic "1" on pin 1.

What is claimed is:

1. In an electronic weigh system comprising auto gain means for automatically correcting the gain of the weigh system so as to maintain an accurate relationship between the weight of a load being measured and the value displayed or recorded, the weighing system being such that a train of pulses representing, by its repetition rate, the weight of the load, is counted over a predetermined time interval, the improvement comprising: means for establishing said predetermined time interval by counting a predetermined number of pulses in a network supplied with clock pulses and with additional pulses, the number of which additional pulses corresponds to a nominal value if the required gain correction is zero but which otherwise corresponds to a correction value which varies about the nominal value according to the magnitude and sign of the correction of gain required, means for introducing a reference into a load measuring circuit to simulate precisely a predetermined load value, means for passing the reference weight pulses to a gain counter over a nominal time interval and means for utilising the least significant digits of the count to the same order as the nominal value to represent the correction value for determining the number of additional pulses to be fed to said network during each weighment.

2. A weigh system as claimed in claim 1, comprising a detector means for determining whether any gain correction required lies within predetermined limits and, if not, indicates or causes an indication to be made to the effect that automatic gain correction has not been achieved.

3. A weigh system as claimed in claim 1, wherein the additional pulses to be fed to said network are derived from a clock source providing said clock pulses and said additional pulses are delayed so as to be interleaved in time with said clock pulses.

4. A weigh system as claimed in claim 3, wherein the addtional pulses are derived by multiplying the clock pulses by a factor related to the clock pulse repetition rate and the duration of said predetermined time interval.

5. A weigh system as claimed in claim 1, wherein the number of addition pulses fed to said network is determined by feeding said pulses from the commencement of said predetermined time interval until the number of clock pulse from the same commencement are equal to the correction value number of pulses.

6. A weigh system as claimed in claim 5, wherein at the commencement of said predetermined time interval, a gate included in the path of said additional pulses to said network is opened and the number of clock pulses is compared with the number of correction pulses in a comparator and at equality said comparator causes said gate to close.

7. A weigh system as claimed in claim 1, wherein an automatic zero correction cycle is performed before each automatic gain correction cycle.

8. A weigh system as claimed in claim 7, wherein the zero correction cycle is initiated according to a predetermined programme and the satisfactory completion of the zero correction cycle initiates a gain correction cycle.

9. A weigh system as claimed in claim 1, wherein the load measuring circuit comprises a load cell bridge which provides an analogue output which is converted to a pulse output in a converter so that the repetition rate of the pulse is proportional to the analogue output.

10. A weigh system as claimed in claim 9, wherein the means for introducing a reference into the load measuring circuit for simulating precisely a predetermined load value, comprises precision resistance means and switch means for connecting the resistance means across appropriate arms of the load cell bridge during the automatic gain control cycle.

11. A weigh system as claimed in claim 9, for in-motion weighing of rail cars, wherein the load cells of the load cell bridge support a weigh-rail arrangement.

12. Apparatus for automatically correcting the gain of an electronic measuring system so as to maintain an accurate relationship between the magnitude of the characteristic being measured and the value displayed or recorded, the measuring system being such that a train of pulses is counted over a predetermined time interval with the train of pulses representing, by its pulse repetition rate, the magnitude of said characteristic, the improvement comprising, in combination: means for providing a reference count, means for generating a pulse train simulating a predetermined magnitude of said characteristic; means for counting the pulses of the generated pulse train; means for comparing the reference count with the count of the generated pulse train to determine any error in the gain; and means for automatically adjusting the predetermined time interval to correct the effect of the determined gain error.

13. Apparatus as described in claim 12, wherein said means for providing a reference count comprises a clock pulse generator and a counter, and wherein means are provided coupled to the clock pulse generator output for counting clock pulses to a predetermined count for determining said predetermined time interval.

14. Apparatus as described in claim 13, including means coupled to said clock pulse counting means for adding or subtracting pulses to or from those provided by the clock pulse generator to adjust the time interval.

15. Apparatus as described in claim 13, including a divider chain coupled between said clock pulse generator and said means for counting clock pulses.

16. A method for automatically correcting the gain of an electronic measuring system so as to maintain an accurate relationship between the magnitude of the characteristic being measured and the value displayed or recorded, the measuring system being such that a train of pulses is counted over a predetermined time interval with the train of pulses representing, by its pulse repetition rate, the magnitude of such characteristic, the improvement comprising the steps of: providing a reference count; generating a pulse train simulating a predetermined magnitude of said characteristic; counting the pulses of the generator pulse train; comparing the reference count with the count of the generated pulse train to determine any error in the gain; and automatically adjusting the predetermined time interval to correct the effect of the determined gain error.

17. A method as described in claim 16, wherein the predetermined time interval is determined by the step of counting clock pulses to a predetermined count.

18. A method as described in claim 17, wherein the adjustment of the time interval is obtained by the method of adding or subtracting pulses to or from those provided by the clock.

19. A method as described in claim 17, wherein the adjustment of the time interval is obtained by the step of varying the clock pulse repetition rate.

20. A method as described in claim 17, in which the clock pulses pass through a divider chain before counting and wherein the adjustment of the time interval is obtained by the step of varying the dividing factor.

* * * * *